United States Patent [11] 3,573,456

[72] Inventor Roland C. M. Beeh
Brentwood, L. I., N.Y.
[21] Appl. No. 660,862
[22] Filed July 26, 1967
[45] Patented Apr. 6, 1971
[73] Assignee OPTOmechanisms, Inc.
Plainview, N.Y.

[54] HIGH RESOLUTION PROJECTION MEANS FOR PRINTING MICRO CIRCUITS ON PHOTORESIST MATERIAL
1 Claim, 4 Drawing Figs.

[52] U.S. Cl. .......... 250/65, 96/36, 156/8, 250/86, 350/1, 355/71
[51] Int. Cl. .......... G03b 27/32
[50] Field of Search .......... 350/1, 2, 189; 250/86, 65; 156/8; 355/71; 96/36 (2)(PC)

[56] References Cited

UNITED STATES PATENTS

| | | | |
|---|---|---|---|
| 3,334,543 | 8/1967 | Perner et al. | 355/71 |
| 2,569,793 | 10/1951 | Anderson | 250/86X |
| 3,035,490 | 5/1962 | Tibbetts | 350/2 |
| 3,236,707 | 2/1966 | Lins | 96/36.2X |
| 3,255,005 | 6/1966 | Green | 96/36.2 |
| 3,295,407 | 1/1967 | Jeffree | 350/189 |

OTHER REFERENCES

" IBM Technical Disclosure," Vol. 8, No. 6, November, 1965, pg. 881

*Primary Examiner*—Ralph G. Nilson
*Assistant Examiner*—A. L. Birch
*Attorney*—James P. Malone

ABSTRACT: A high resolution projection means for printing demagnified micro circuits or images on photoresist material comprising a monochromatic ultra violet light, a band-pass filter, a quartz condenser lens system, and uncorrected quartz objective lens system and a fluorite aspheric correction plate for the uncorrected lens system.

INVENTOR.

ROLAND C.M. BEEH

James P. Malone

INVENTOR.
ROLAND C.M. BEEH
James P. Malone

HIGH RESOLUTION PROJECTION MEANS FOR PRINTING MICRO CIRCUITS ON PHOTORESIST MATERIAL

This invention relates to means for projecting high resolution images into silicon wafers coated with photoresist material. It also is applicable to glass metallized plates coated with photoresist materials or to any material requiring photographic etching and utilizing a photosensitive emulsion.

In manufacturing microcircuits, it is desirable to print demagnified high resolution images on silicon wafers which have been coated with photosensitive material. The waters are then etched or otherwise treated to produce the projected circuit on the silicon wafer.

A significant evolution is being experienced in the integrated circuitry industry. It has been imposed by the increasing demands of the industry, of the military and of the government sponsored space programs.

This evolution has produced, along with the direct products that are utilized with the integrated circuits, a number of machines of various complexity to perform the necessary operations related to the fabrication of such circuits.

The machines that have been developed to automate the production of integrated circuitry in order to increase the productivity yield, the reliability and reproducibility of the devices, have been submitted to major changes and as the technologies are advancing, there is a need for a machine capable of projecting complex images of high accuracy directly onto silicon wafers.

What is used is an interferometrically controlled step and repeat machine, in order to flash images onto high resolution plates with an increased accuracy over conventional encoders driven by lead screws, and also to improve upon the electronic flashing schedule of the system. Novel optical system are incorporated in the machine in order to provide aerial resolution in excess of 600 lines per millimeter with reduction ratios 10× and 4× objectives.

BASIC REQUIREMENTS OF PHOTORESIST APPLICATION

Presently, the wafers utilized with the photoresist have dimensions in the order of 1,500 inch diameter. Some sources are now developing larger crystal ingots of 3 inches in diameter.

The present technology utilizes masks that are located against the surface of the silicon slice and are contact printed. Contact printing offers one major advantage. It is fast, as for many as 1000 circuits can be reproduced onto the slice at one time. Considering the multiple mask apparatus, and the subsequent diffusion operations, contact printing offers high volume capabilities.

Unfortunately, it also exhibits serious limitations:

1. The operator is required to visually align the juxtaposed mask through a difficult optical technique, requiring skill.
2. Contact printing cannot be achieved without substantial loss in resolution.
3. The wafers, while they are processed through the diffusion furnaces, may lose their original flatness. Loss of resolution occurs.
4. The diffusion process also creates on the surface microscopic semiconductor dendrites or other imperfections which are abrasive and destroy the masks (scratches, pin holes).
5. Frequent inspection of the masks are required even though some of the masks are glass metal etched slides instead of direct photographic plates, this to increase longevity of the masks utilized in the process.

The above fundamental limitations of the direct contact printing approach indicates a need for a direct projection system, in which there is no direct contact between the image and the silicon itself. Consequently, the method would utilize master photographic plates whose life would be unlimited, and imperfections in the silicon slices, and deviations from flatness as long as they reside within the depth of field of the objective utilized would not introduce loss in resolution. The present invention provides such a system.

The first differentiation between a conventional step and repeat camera and the present photoresist camera resides in the optics utilized.

Conventional photoresist materials, such as the Kodak products KPR, KMER, KTFR, exhibit spectral response in the ultraviolet region instead of covering the visual range of the spectrum. This is due to the nature of the gelatins that are utilized with the process. Such gelatins, when incorporated with light sensitive materials and exposed to light, offer selective insolubility which is utilized for chemical etching of exposed section.

FIG. 2 shows the spectral sensitivity of the photoresist material, now utilized widely in the industry since it offers high resolution and has a velocity most suitable to spinning onto silicon slices.

It must be emphasized that the thickness of the photoresist over the silicon wafer should be uniform and be free of pin holes.

The spectral sensitivity of the photoresist materials clearly indicates that conventional photographic objective cannot be utilized to project images onto silicon wafers, for standard glasses offer low transmission in the ultraviolet region of the spectrum, and conventional light sources also emit radiation mostly in the visible and infrared regions.

Consequently, the system requires a suitable light source, the utilization of a suitable condensing system, the use of suitable image supporting dielectric and the use of a special objective.

Increasing the exposure time reduces greatly the useful productivity yield of the semiconductor integrated circuitry. It also requires extremely stable supporting optical systems in order to reduce vibration during exposure and assure good edge definition on lines as small as 2.5 microns or narrower.

Accordingly a principal object of the present invention is to provide high resolution projection means for photoresist materials.

Another object of the present invention is to provide high resolution projection means having a large aperture objective lens with a resolution exceeding 600 lines per millimeter.

Another object of the invention is to provide high resolution ultraviolet projection means comprising a source of ultraviolet light beam, a band pass filter, and a quartz objective lens.

Another object of the invention is to provide high resolution ultraviolet projection means comprising a source of ultraviolet light beam, a band pass filter, and a quartz objective lens and an aspheric plate adapted to correct said quartz.

These and other objects of the invention will be apparent from the following specification and drawings of which:

THE LIGHT SOURCE

Figures 1, 2:
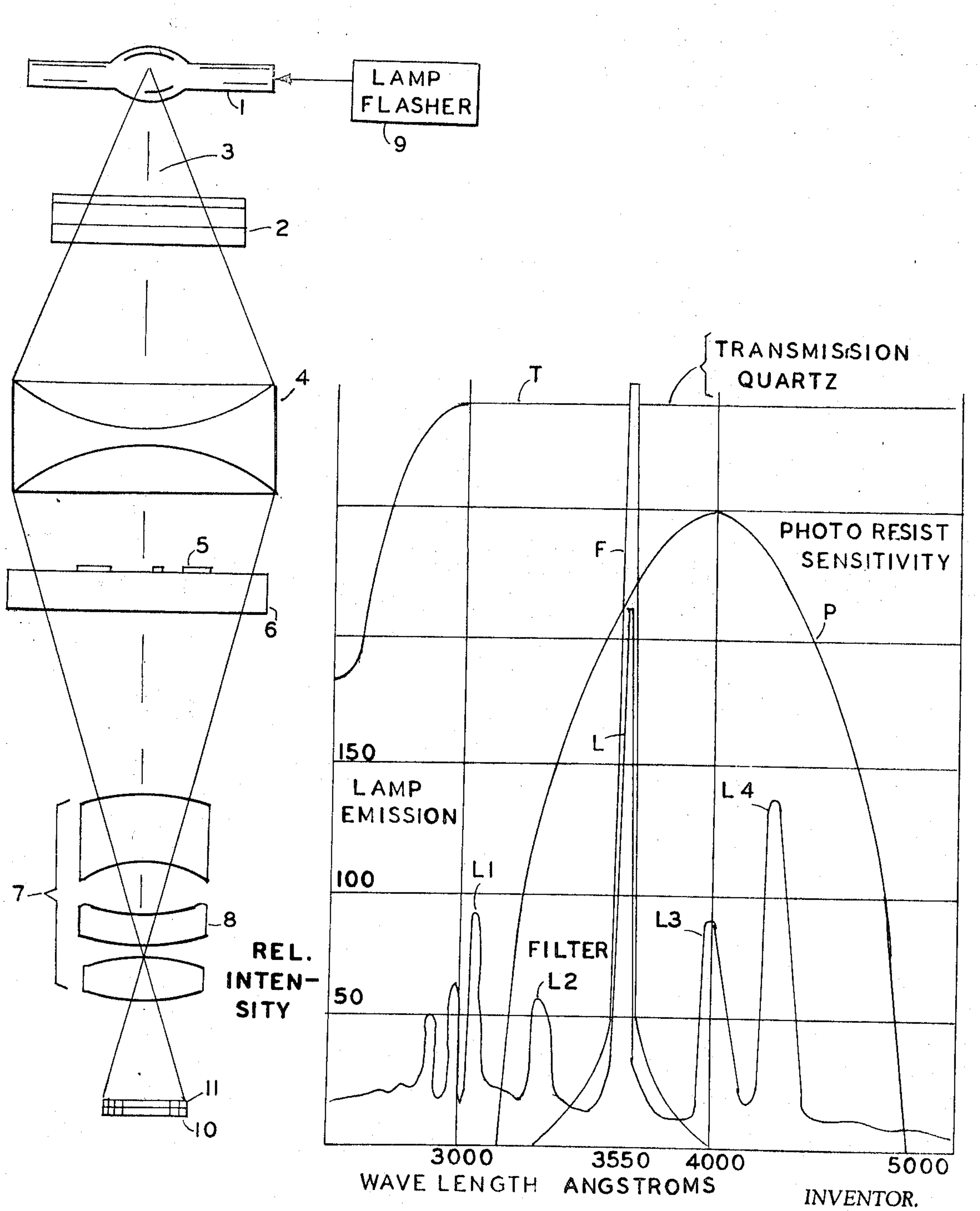
FIG. 1 is an elevation view of an embodiment of the invention.
FIG. 2 is a diagram illustration of the operation of the invention.

Flash lamps 1, FIG. 1, utilizing quartz envelopes, and comprising mixtures of Mercury and Xenon gases, exhibit spectral response within the sensitivity region of the photoresists. The present invention is related to the utilization of a light source offering narrow point source of emission, which spectral response is shown in FIG. 2. The response indicates major peaks at 3650.248 Angstroms and 3660.933 Angstroms units.

Such light source can be triggered with a narrow pulse; it radiates within 5 microseconds minimum or can be DC operated.

CONDENSING OPTICS

The most suitable dielectric material offering spectral response in the ultraviolet spectrum, and also corresponding to the response of the photoresist material, is quartz. Reference is made to FIG. 2, showing the spectral response of fused quartz, optical grade, offering a minimum concentration of bubbles and inclusions.

This invention utilized the selection of quartz blanks of large dimensions and the fabrication of condenser by selecting portions of the quartz ingots.

Large condenser lenses 4 are required to gather the radiative pattern of the light sources. Approximately 5 inches in diameter planoconvex lenses are utilized.

IMAGE HOLDERS OR PHOTOGRAPHIC PLATE MASTERS

The image to be projected onto the silicon wafers are provided onto ultraflat quartz photographic plates 6 which are coated with emulsions similar to the emulsions utilized in Kodak high resolution plates. Such emulsions allow for resolutions have 2000 lines per millimeter and are of high contrast; they also exhibit extremely fine edges of less than one-tenth micron.

The present invention utilizes the selection of quartz 2×2 inch substrates, free of inclusions, and of flatness controlled with 0.005″, 0.060″ thick or thicker, provided with antireflection vacuum deposited coatings. These master plates will bear high resolution targets, or will incorporate typical integrated circuits patterns.

OBJECTIVES

Step and repeat cameras make use of objectives offering large aperture ratios to minify images from 3 to 10 times or higher. There are a number of objectives available, however, the design of such optical systems, in order to achieve resolution (above 600 lines per millimeter across a 1½inch field diameter at the image plane), have imposed a number of practical norms, which are:

The distance between object and image should be kept within 12 inches. Longer distances introduce vibrational factors between the image planes and the objects. To minimize these effects, bulky castings or heavy columns must be constructed while space is obtained at premium cost.

Operating lenses at a specific frequency may not provide in most cases sufficient energy to expose the photographic plate, and those maximum resolution demands monachromocity, lenses are made to operate within a certain band width. Let us consider a lens which operates between two boundaries of the optical spectrum having *li* for its maximum wavelength, corresponding to an index of refraction *mi* and *le* the minimum wavelength with an index of refraction *me* and considering an objective made out of glass having corresponding indexes of refraction *me* and *mi* path difference *b—a* depends upon the relation:

$$b-a=\frac{li-le}{(me-1)(mi-1)}$$

Considering, for instance, a glass having an index of refraction *mi*=1.5100 at 5700 Angstroms, or *li*, and having for *me*=1.512 index at 5200 Angstroms, we see that *b—a*=25 Angstroms. This value of 25 Angstroms units will contribute to an edge indefinition of 25 Angstroms on each side of a line.

Considering a broader spectral operation, for instance, from 5876 down to 4358 Angstroms, with a glass such as BK–6 exhibiting corresponding changes of indices or refractions of 1.51009 and 1.54167, the indefinite edge in this case is 73.5 Angstroms units.

While in the visible range it is possible by introducing apochromatic lenses to allow for the selection of dielectric media which bring the various wavelengths at one specific point this is most difficult to achieve with lenses that are to operate in the ultraviolet range.

Extreme resolution is achieved with monochromacity, and while monochromacity must be respected, sufficient energy of the light source must be available to expose the photographic plates within the shortest period of time as possible.

There is no problem in the visible, since the lenses can be corrected and, for instance, in the green region ample photon energy is available.

In the ultraviolet, at specific wavelengths, except for some peaks of wavelengths as shown in FIG. 2 little energy is available for a specific band pass and consequently exposure duration suffers. Broadening the band pass as it will be shown reduces resolution; correcting lenses with various refractory glasses is not economical and difficult in the ultraviolet range, since quartz and fluorite are the best material operating in this range.

The resolution power *R* is given by the formula:

$$R=\frac{l}{1.221Fo}$$

Where *l* is the wavelength of the light utilized.

*Fo* is the working condition corresponding to the *F* number of the objective utilized.

The equation indicates that the shorter the wavelength, the greater *R* will be.

In practice, there are available presently a limited number objectives which resolve above 600 lines per millimeter in the visible spectrum. However, such aerial resolution is obtained by operating most of these lenses from 5700 Angstroms down to 5200 Angstroms. This band pass of 500 Angstroms corresponds to effective line resolutions from 1438 to 1576 lines per millimeter, this for a specific *F* aperture.

The above was calculated assuming F=1, while in practice the effective number is slightly larger and the deterioration in resolution will cause increased edge indefinition. Of course, such analysis applies to lenses whose curvatures have been prepared with extreme care so as to reduce spherical aberration.

The above analysis, and the present experience acquired with the fabrication of objectives operating in the visible range, indicate there are three basic approaches to the construction of an objective capable of resolving 2.5 microns lines or better onto photoresists.

APPROACH ONE

Utilize a conventional high resolution objective, which normally operates in the visible spectrum between 5700 and 5200 Angstroms, by widening its operational band. For instance, utilize the lens from 4358 A. to 5876 A. understanding that edge definition losses may range in actual practice from 73.5 Angstroms to 250 Angstroms. This is due to the inability of the various apochromatic glasses to correct in the lower regions, for indexes of refraction narrow down in the ultraviolet.

Besides, utilizing the conventional lenses, the photon energy reaching the photographic plate is dependent upon the properties of the light source and also upon the transmission capability of the objective itself and of all interposed dielectric media between the source and the photographic plate.

A light source produces energy in Watt-seconds or joules accordingly to the equation:

$j=\frac{1}{2}CV^2$ in which *C* is the capacitance in microfarads and *V* the voltage in kilovolts necessary to ionize the gas and generate an arc.

The source utilized with the system delivers radiation in the order of 2 watt-seconds.

At the photographic plate accordingly to Scwartzchild equation, the quantum yield to produce the effective photochemical process is:

$$Q=\frac{j}{w}\qquad\frac{\text{number of molecules reacted}}{\text{number of quanta absorbed}}$$

Considering a photoresist material deposited on a silicon substrate of 1,000 Angstroms film thickness, the available centers which may be sensitized within the structure over a desired line of 2.5 micron as specified and considering this line to be 5 millimeters long, the number of centers that may be activated occupy states in a lattice constant averaging 50 Angstroms, which corresponds to fish glue gelatin and assuming the material is isotropic $n=2.5\times10^5$, and considering the energy of a photon at 5,200 Angstroms–$3.81\times10^{112}$erg=2.38 ev., and at 5,700 Angstroms–$3.48\times10^{112}$erg=2.17 ev. the energy on one center is:

$$E\ (\text{ergs})=SN=N\ hv$$

$$N=6.02\times10^{23}$$

Since one calorie$=4.18\times10^{7}$ ergs $$E\ \text{kcal.}=\frac{NL}{4.18\times10^{7}\times10^{3}}\ v=9.53\times10^{-14}v$$

or $$NL\frac{c}{j}=\frac{286{,}000}{5{,}200}=55 \text{ kilocalories at } 5{,}700 \text{ A.}$$

$$=\frac{286{,}000}{5{,}700}=50\ \text{kcal.}$$

Considering ultraviolet radiation, the energy absorbed per center is at the natural line of the source 3650 A., which corresponds to $5.47\times10^{112}$ ergs=3.41 ev.

E=78 Kilocalories

The energy required to produce the chemical reaction within a light sensitive system, or the upper limit for spectral sensitization is 16 kilocalories.

Comparison of the operation spectrum energy levels clearly indicates that for green light 50 to 55 kilocalories are available in the 500 band spectrum with electron energies of only 2.38 ev. down to 3.38 ev. down to 2.17 ev. Choosing a spectra of 3.41 ev. corresponds to 78 kilocalories of energy available per center.

The utilization of a conventional lens, offering high resolution capabilities and by widening its response from the limit of absorption of the glasses utilized, which is in the order of 3,800 Angstroms and up to 4,800 Angstroms with a 1,000 Angstroms band, would introduce edge indefinitions in the order of 500 Angstroms. Consequently, the resolution capabilities to be able to print a 2.5 micron line becomes marginal.

In addition, the utilization of such lens would be limited by the energy available in such selected spectrum band as shown in FIG. II.

There are only two major peaks in these regions of relative intensity, 80 and 135, compared to a 220 relative intensity of a double line at 3650 A. and 3660 A.

Consequently, it is not recommended to utilize a conventional lens and lower its spectral operational range by still retaining its resolution capabilities and its efficiency in order to obtain short exposures onto the photoresist.

APPROACH TWO

It may be possible to secure an objective which will operate from 3,800 Angstroms up to 4,300 Angstroms with a 500 micron band width. Even though this optical system will exhibit edge definitions in the order of 100 Angstroms, it will not allow for rapid exposures onto the photographic plates due to the low selection of relative intensity of the spectrum utilized.

However, this lens utilizing classical optical design techniques can be constructed by selecting low spectral operational glasses for corrected spectrum over the 500 Angstroms band. It will be consequently utilized with a wide band pass filter.

APPROACH THREE

This approach oriented toward the fabrication of an objective having large aperture, resolution exceeding 600 lines per millimeter, operating at a single frequency with a band pass of 50 Angstroms.

Reference is made to FIG. 2 showing a narrow band pass filter selected for this lens. The filter may be of multilayer dielectric.

This approach is based upon the fabrication of a monochromatic objective of quartz which will not be corrected for chromatic aberrations.

Basically, the system is multielement objective 7 fabricated out of fused quartz from selected blanks with one corrective aspherical or spherical element depending upon the chosen geometry element 8 fabricated out of fluorite.

The correcting element exhibiting an index of refraction of 1.432 will be combined with the other elements offering a refraction index of 1.478 within the specific chosen blank. The aspheric plate is to be utilized to correct for distoration of the image edges and for anomalies in the spherical elements of the objective.

More specifically referring to FIG. 1, the light source 1 may be a high intensity Xenon Mercury lamp with conventional power supply and conventional trigger means 9 to flash the lamp. The band pass filter 2 may be of quartz with dielectric layers and an antireflection coating. The lamp is adapted to transmit a high intensity beam along the axis 3. A quartz condenser lens 4 is mounted on the axis which is adapted to pass the light beam through the image to be projected which is a high resolution photographic emulsion 5 mounted on a quartz plate 6. The projected beam then passes through a quartz objective lens 7 and through an aspheric fluorite plate which is especially ground to correct the uncorrected quartz lens. The high resolution high energy beam then passes on to the silicon wafer 10 upon which is a layer 11 photoresist material and prints through a demagnified, or minified microimage.

After the picture has been printed on the layer 11 of the photoresist material, then the silicon wafer is etched or otherwise processed in order to create on the wafer a copy of the circuit to be printed.

Referring to FIG. 2, there is shown a diagram illustrating the wavelength characteristics of the various elements. The photoresist material sensitivity is plotted by the curve *P* against the wavelength in Angstroms. The lamp emission curve is shown by the waveform *L* which also has peaks L1, L2, L3, L4. Since it is desired to limit the transmission to one frequency, a narrow band-pass pass filter is chosen to transmit the highest peak *L*. The curve of the band filter shown by the peak *F* and the center band passed frequency is in the neighborhood of 3550 A. Angstroms. The curve *T* shows the transmission characteristics of quartz.

This invention provides sufficient power, with high resolution within the sensitivity band of the photoresist material. The filter tends to eliminate any noise frequency and all the transmission elements are of quartz which has good transmission for the chosen frequency.

Figure 3:
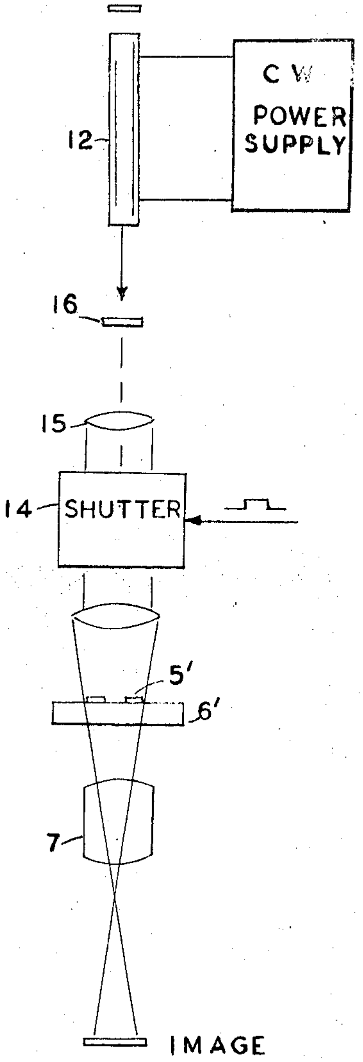

FIG. 3 shows a modification of the invention wherein the light source 12 is a gaseous laser cavity which comprises an Argon source having a fundamental mode of operation at 4880 Angstroms. This gaseous laser, or any other gas exhibiting monochromacity, or coherence in its excited state, may be used. The laser beam is passed through semitransparent mirror 16 and lens 15.

In some cases in which the exposure must be controlled accurately, and since it is preferable to operate the laser in a continuous mode, the source operates with 14, a light valve.

Figure 4:
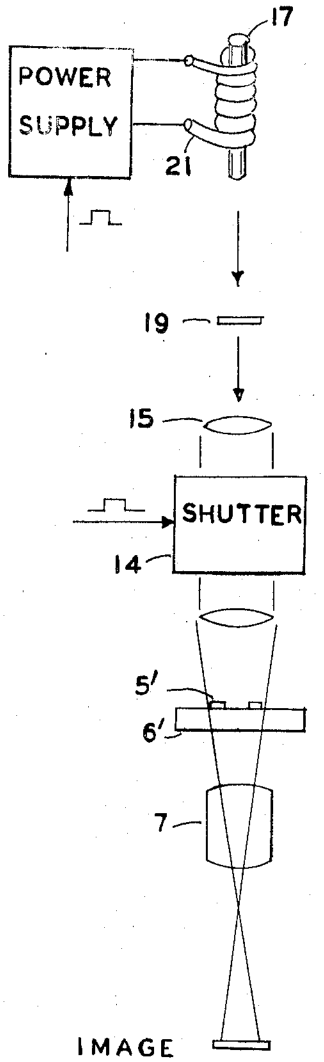
FIGS. 3 and 4 are elevation views of modifications of the invention.

FIG. 4 shows a modification of the invention wherein: the light source 17 is a solid state laser exhibiting emissivity in the ultraviolet portion of the optical spectrum, which is excited by the flash lamp.

In this application the flash lamp 21 is monitored through the means of a pulsed power supply 18 to excite the laser rod. A narrow band pass filter 19 and a Kerr cell, or light valve 20, or other suitable shutter may be incorporated with the lamp to narrow down the exposure duration.

Many modifications may be made by those who desire to practice the invention without departing from the scope thereof which is defined by the following claims.

I claim:

1. Monochromatic ultraviolet projection means for high resolution printing on photoresist material comprising a sheet of photoresist material having a predetermined sensitivity curve and responsive to ultraviolet radiation;

a nonmonochromatic source of coherent radiation exhibiting one or several sharp peaks of emission in the ultraviolet spectrum adapted to transmit along an axis;

a narrow band pass filter comprising a block of quartz with dielectric layers mounted on said axis adapted to pass a narrow band of light centered about one of the peaks of emission in the ultraviolet spectrum, which also falls within the sensitivity curve of said photoresist material;

a quartz condenser lens mounted on said axis below said band pass filter;

a quartz plate mounted on said axis below said condenser lens, said plate being adapted to mount the image to be projected;

a quartz objective lens mounted on said axis below said plate; and said photoresist material being mounted on said axis at the focal point of said quartz objective lens.